US010304836B1

(12) United States Patent
Tallman et al.

(10) Patent No.: US 10,304,836 B1
(45) Date of Patent: *May 28, 2019

(54) PROTECTIVE LAYERS FOR HIGH-YIELD PRINTED ELECTRONIC DEVICES

(71) Applicant: Xerox Corporation, Norwalk, CT (US)

(72) Inventors: Kyle B. Tallman, Perry, NY (US); Jonathan H. Herko, Walworth, NY (US); Michael S. Roetker, Webster, NY (US); Amy Catherine Porter, Rochester, NY (US); Lin Ma, Pittsford, NY (US); David M. Skinner, Rochester, NY (US); Eric Robert Dudek, Webster, NY (US); Scott J. Griffin, Fairport, NY (US)

(73) Assignee: XEROX CORPORATION, Norwalk, CT (US)

( * ) Notice: Subject to any disclaimer, the term of this patent is extended or adjusted under 35 U.S.C. 154(b) by 4 days.

This patent is subject to a terminal disclaimer.

(21) Appl. No.: 16/038,372

(22) Filed: Jul. 18, 2018

(51) Int. Cl.
H01L 29/94 (2006.01)
H01L 27/10 (2006.01)
H01L 23/528 (2006.01)
H01L 49/02 (2006.01)
H01L 21/288 (2006.01)
(Continued)

(52) U.S. Cl.
CPC ...... *H01L 27/101* (2013.01); *H01L 21/02288* (2013.01); *H01L 21/288* (2013.01);
(Continued)

(58) Field of Classification Search
CPC .... H01L 27/101; H05K 1/0231; H05K 1/112; H05K 1/185; H05K 2201/10712; H05K 3/12; H05K 3/4602
See application file for complete search history.

(56) References Cited

U.S. PATENT DOCUMENTS 3,720,862 A * 3/1973 Mason ............... C03C 3/074
361/320
4,713,157 A * 12/1987 McMillan ........... C23C 14/06
204/192.11
(Continued)

FOREIGN PATENT DOCUMENTS

WO WO2006135245 12/2006
WO WO2006135246 12/2006
WO WO2006135247 12/2006

*Primary Examiner* — William H. Mayo, III
*Assistant Examiner* — Krystal Robinson
(74) *Attorney, Agent, or Firm* — Bell & Manning, LLC

(57) ABSTRACT

Printed electronic devices are provided. In embodiments, such a device comprises a plurality of contact pads arranged in a pattern; a plurality of electrode traces arranged in another pattern, the plurality of electrode traces comprising a set of bottom electrode traces and a set of top electrode traces, each electrode trace in electrical communication with an associated contact pad of the plurality of contact pads; a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers; and a protective layer covering the plurality of electrode traces, the protective layer formed from a curable composition comprising an amine modified polyester (meth)acrylate, a (meth)acrylated amine oligomer, a (meth)acrylate monomer, a clay mineral, and a photoinitiator.

19 Claims, 2 Drawing Sheets

(51) Int. Cl.
*H01L 21/02* (2006.01)
*H01L 23/00* (2006.01)
*H05K 3/28* (2006.01)
*H05K 1/16* (2006.01)
*H05K 1/11* (2006.01)
*H05K 3/12* (2006.01)
*H05K 3/40* (2006.01)

(52) U.S. Cl.
CPC ............ *H01L 23/528* (2013.01); *H01L 24/03* (2013.01); *H01L 24/06* (2013.01); *H01L 28/60* (2013.01); *H05K 1/111* (2013.01); *H05K 1/162* (2013.01); *H05K 3/12* (2013.01); *H05K 3/285* (2013.01); *H05K 3/4007* (2013.01); *H01L 2224/0331* (2013.01); *H01L 2224/06131* (2013.01); *H05K 2201/09227* (2013.01); *H05K 2201/09409* (2013.01); *H05K 2201/10159* (2013.01)

(56) References Cited

U.S. PATENT DOCUMENTS

| | | | | |
|---|---|---|---|---|
| 5,214,300 | A | * | 5/1993 | Rohrer .................... C23C 14/06 |
| | | | | 257/295 |
| 7,374,954 | B2 | * | 5/2008 | Kang ....................... G11C 11/22 |
| | | | | 438/240 |
| 9,412,705 | B2 | | 8/2016 | Karlsson et al. |
| 2007/0049155 | A1 | | 3/2007 | Moro et al. |
| 2007/0138520 | A1 | * | 6/2007 | Leenders .............. H01L 27/101 |
| | | | | 257/295 |

\* cited by examiner

PROTECTIVE LAYERS FOR HIGH-YIELD PRINTED ELECTRONIC DEVICES

BACKGROUND

Printed electronics based on memory cells are used in a wide variety of applications, including as labels, tags and sensors. The memory cells are capacitor-like structures, each structure including a layer of a memory material sandwiched between a pair of electrode layers. The memory cells may be accessed via conductive traces linking the electrodes to an electronic driver and detection circuitry which may be located on the periphery of the memory cells or in a separate module, e.g., a read/write unit. Depending upon the application, the printed electronic device may contain a few or up to several million memory cells. In order to protect the memory cells from external forces which can damage the cells, surfaces of the printed electronic device may be coated with a protective material. Regardless of the particular configuration of the printed electronic device, the yield of the device is generally maximized in order for the device to operate as intended (e.g., to allow for accurate and efficient reading of, and writing to, the individual memory cells). Unfortunately, factors in the fabrication process, including the formation of protective coatings, can contribute to reduced yield of the devices.

SUMMARY

Provided are protective layers for printed electronic devices and methods of fabricating and using such devices.

In one aspect, printed electronic devices are provided. In embodiments, such a device comprises a plurality of contact pads arranged in a pattern; a plurality of electrode traces arranged in another pattern, the plurality of electrode traces comprising a set of bottom electrode traces and a set of top electrode traces, each electrode trace in electrical communication with an associated contact pad of the plurality of contact pads; a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers; and a protective layer covering the plurality of electrode traces, the protective layer formed from a curable composition comprising an amine modified polyester (meth)acrylate, a (meth)acrylated amine oligomer, a (meth)acrylate monomer, a clay mineral, and a photoinitiator.

In another aspect, methods of fabricating printed electronic devices are provided. In embodiments, such a method comprises printing a plurality of bottom electrode traces on a substrate; printing a layer of a ferroelectric material on the plurality of bottom electrode traces; printing a plurality of top electrode traces on the layer of the ferroelectric material, wherein the plurality of bottom and top electrode traces forms a plurality of electrode traces arranged in a pattern and defines a plurality of memory cells, each memory cell located at an intersection of a pair of electrode traces of the plurality of electrode traces; printing a plurality of contact pads on the plurality of electrode traces, wherein the plurality of contact pads is arranged in another pattern and each electrode trace of the plurality of electrode traces is in electrical communication with an associated contact pad of the plurality of contact pads; printing a curable composition to cover the plurality of electrode traces, the curable composition comprising an amine modified polyester (meth)acrylate, a (meth)acrylated amine oligomer, a (meth)acrylate monomer, a clay mineral, and a photoinitiator; and curing the curable composition to provide a protective layer.

In another aspect, methods of using printed electronic devices are provided. In embodiments, such a method comprises contacting a plurality of contact pads of a coated, printed electronic device with a plurality of pins of a read/write unit, the device comprising the plurality of contact pads arranged in a pattern; a plurality of electrode traces arranged in another pattern, the plurality of electrode traces comprising a set of bottom electrode traces and a set of top electrode traces, each electrode trace in electrical communication with an associated contact pad of the plurality of contact pads; a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers; and a protective layer covering the plurality of electrode traces, the protective layer formed from a curable composition comprising an amine modified polyester (meth)acrylate, a (meth)acrylated amine oligomer, a (meth)acrylate monomer, a clay mineral, and a photoinitiator.

These and other aspects will be discussed in greater detail below.

BRIEF DESCRIPTION OF THE DRAWINGS

Illustrative embodiments will hereafter be described with reference to the accompanying drawings.

DETAILED DESCRIPTION

Figure 1A:
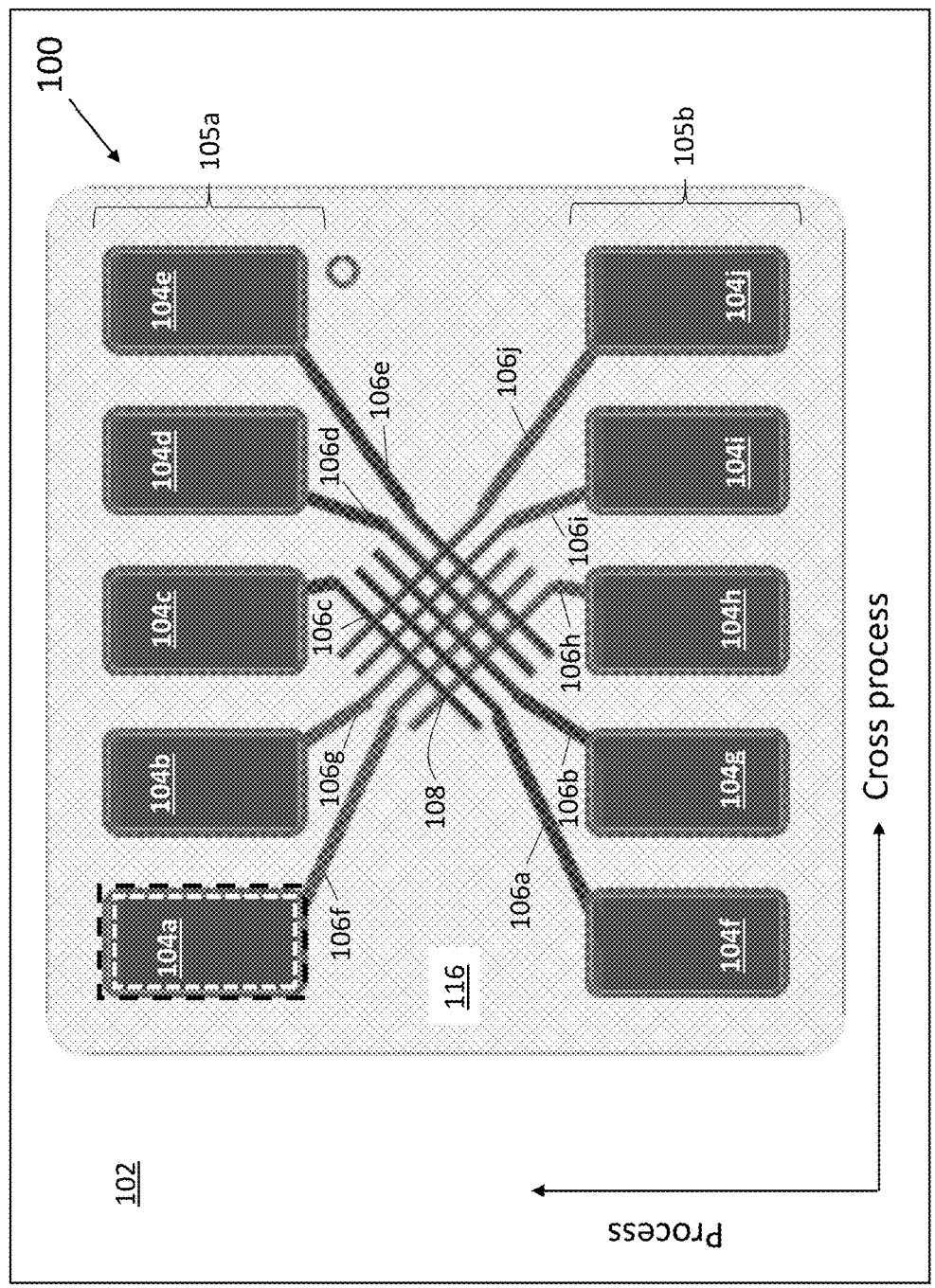
FIG. 1A depicts a top view of a printed electronic device according to an illustrative embodiment.

Provided are protective layers for printed electronic devices and methods of fabricating and using such devices.

The printed electronic devices are based on arrays or matrices of memory cells known as passive arrays or matrices. The devices are multilayer structures comprising stacked layers, each layer composed of a different material and/or configured in a different pattern, depending upon the function of the layer. The devices comprise a plurality of contact pads arranged in a pattern; a plurality of electrode traces arranged in another pattern, the plurality of electrode traces comprising a set of bottom electrode traces and a set of top electrode traces, each electrode trace in electrical communication with an associated contact pad of the plurality of contact pads; a plurality of memory cells, each memory cell located at an intersection of a pair of electrode traces of the plurality of electrode traces; and a protective layer covering the plurality of electrode traces. Each memory cell comprises a bottom electrode layer, a top electrode layer, and a ferroelectric layer between the top and bottom electrode layers. The top and bottom electrode layers of the memory cells correspond to regions of top and bottom electrode traces, respectively. Moving from bottom to top in the devices, the set of bottom electrode traces is one of the layers of the multilayer structure, the ferroelectric layer is a layer overlying the set of bottom electrode traces, the set of top electrode traces is a layer overlying the ferroelectric layer, the plurality of contact pads is a layer overlying the set of top electrode traces and the protective layer is a layer overlying the plurality of contact pads. The protective layer may be the topmost layer in the device.

The protective layer protects the underlying layers of the printed electronic devices from a variety of external forces which can damage the devices, e.g., scratches, abrasion, chemicals, etc. Although such protection is advantageous, formation of conventional protective layers has been accompanied by a decrease in yield of the coated printed electronic device. The present disclosure is based, in part, on the finding that the yield of printed electronic devices is improved (i.e., increased) when using protective layers formed from particular curable compositions. The increased yield is further described below with respect to an illustrative embodiment of a printed electronic device.

The present protective layers are formed from curable compositions which comprise a polymer component, an oligomer component, a monomer component, a clay mineral and a photoinitiator. Here, and throughout the present disclosure, "a" means one or more, e.g., combinations of different types of monomers may be used in the curable compositions. Regarding the polymer, in embodiments, the curable composition comprises an amine modified polyester (meth)acrylate. Here, and throughout the present disclosure, "(meth)acrylate" encompasses both methacrylate and acrylate compounds. The amine modified polyester (meth)acrylate may be characterized by its dynamic viscosity at 25° C. In embodiments, the dynamic viscosity at 25° C. is in the range of from 100 cPs to 10,000 cPs, from 1,000 cPs to 10,000 cPs, or from 500 cPs to 5,000 cPs. The dynamic viscosity may be measured using a commercially available rheometer (e.g., Ares-G2 from TA Instruments). The polymer may be included in the curable composition in various amounts including an amount of at least 25%, at least 30%, at least 35%, at least 40%, at least 45%, or in a range of from 25% to 45% or from 30% to 40%. Here, and throughout the present disclosure, amount percentages refer to a weight percent based on the total weight of the curable composition. In embodiments in which more than one species of polymer is present in the curable composition, these amounts refer to the total amount of polymer in the curable composition.

Regarding the oligomer, in embodiments, the curable composition comprises a (meth)acrylated amine oligomer. The oligomer may be included in the curable composition in various amounts including an amount of at least 0.5%, at least 1%, at least 3%, at least 5%, at least 7%, or in a range of from 0.5% to 7% or from 1% to 5%. In embodiments in which more than one species of oligomer is present in the curable composition, these amounts refer to the total amount of oligomer in the curable composition.

Regarding the monomer, in embodiments, the curable composition comprises a (meth)acrylate monomer. A variety of types of (meth)acrylate monomers may be used, including monofunctional (meth)acrylate monomers, difunctional (meth)acrylate monomers, and trifunctional (meth)acrylate monomers. In embodiments, the composition comprises a monofunctional, a difunctional and a trifunctional (meth)acrylate monomer.

(Meth)acrylate monomers including one or more cyclic groups may be used. The cyclic group may be a cyclic alkyl group in which the number of carbons may range from, e.g., 2 to 10, 2 to 8, 2 to 6, etc. The cyclic alkyl group may be unsubstituted, by which it is meant the cyclic alkyl group contains no heteroatoms. The cyclic alkyl group may be substituted, by which it is meant an unsubstituted cyclic alkyl group in which one or more bonds to a carbon(s) or hydrogen(s) are replaced by a bond to non-hydrogen and non-carbon atoms, e.g., an oxygen atom. The cyclic group may be a cyclic alkenyl group in which the number of carbons may range from, e.g., 2 to 10, 2 to 8, 2 to 6, etc. The cyclic alkenyl group may be unsubstituted or substituted as described with respect to cyclic alkyl groups. Illustrative monofunctional (meth)acrylate monomers including cyclic alkyl groups include dicyclopentenyloxyethyl acrylate, dicyclopentadienyl (meth)acrylate and isobornyl (meth)acrylate.

Aliphatic di(meth)acrylates, such as alkyldiol di(meth)acrylates, may be used. In such alkyldiol di(meth) acrylates, the number of carbon atoms in the alkyldiol portion may vary, e.g., in the range of from 4 to 20, from 6 to 18, or from 6 to 12. The alkyl portion may be linear, branched or cyclic. Illustrative alkyldiol di(meth)acrylates include hexanediol di(meth)acrylate, decanediol di(meth)acrylate, and tricyclodecane dimethanol di(meth)acrylate.

Similarly, aliphatic tri(meth)acrylates may be used, in which the number of carbon atoms and the type of alkyl portion may vary as described above with respect to aliphatic di(meth)acrylates. Illustrate alkyldiol tri(meth)acrylates include trimethylolpropane tri(meth)acrylate, glycerol propoxylate tri(meth)acrylate, tris(2-hydroxy ethyl) isocyanurate tri(meth)acrylate, propoxylated trimethylolpropane tri(meth)acrylate, and ethoxylated trimethylolpropane tri (meth)acrylate.

The monomer may be included in the curable composition in various amounts including an amount of at least 20%, at least 25%, at least 30%, at least 35%, at least 40%, or in a range of from 0.1% to 7%, from 0.1% to 5%, from 1% to 5%, from 18% to 40%, or from 25% to 35%. These amounts refer to the amount of an individual monomer present in the curable composition. In embodiments, the total amount of monomer present in the curable composition is at least 20%, at least 30%, at least 45%, at least 50%, or in the range of from 20% to 50% or from 25% to 45%.

Regarding the clay mineral component, in embodiments, the curable composition comprises hydrous magnesium silicate. The clay component may be included in the curable composition in various amounts including an amount of at least 15%, at least 20%, at least 25%, at least 30%, at least 35%, or in a range of from 15% to 35% or from 20% to 30%. In embodiments in which more than one species of clay mineral is present in the curable composition, these amounts refer to the total amount of clay mineral in the curable composition.

Regarding the photoinitiator, any photoinitiator that absorbs radiation, e.g., UV or visible radiation, to induce free radical polymerization reactions between the selected polymer(s), oligomer(s) and/or monomer(s) may be used. Illustrative photoinitiators include mono-acylphosphine oxide photoinitiators and alpha hydroxy ketone photoinitiators. Illustrative photoinitiators include benzoin and benzoin alkyl ethers, such as benzoin, benzil, benzoin methyl ether, benzoin ethyl ether, benzoin n-propyl ether, benzoin n-butyl ether, benzoin isopropyl ether; benzophenones, such as benzophenone, p-methylbenzophenone, Michler's ketone, methylbenzophenone, 4,4'-dichlorobenzophenone, 4,4-bis-diethylaminobenzophenone; acetophenones, such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl[4-(methylthio)phenyl]-2-morpholino-1-propanone, N,N-dimethylaminoacetophenone; thioxanthone and xanthones, such as 2,4-dimethylthioxanthone, 2,4-diethylthioxanthone, 2-chlorothioxanthone, 2,4-diisopropylthioxanthone, isopropylthioxanthone; anthraquinones, such as anthraquinone, chloroanthraquinone, 2-methylanthraquinone, 2-ethylanthraquinone, 2-tert-butylanthraquinone, 1-chloroanthraquinone, 2-amylanthraquinone, 2-aminoanthraquinone; ketals, such as acetophenone dimethyl ketal, benzyl dimethyl ketal; benzoic esters, such as ethyl 4-dimethylaminobenzoate, 2-(dimethylamino)ethyl benzoate, ethyl-p-dimethylaminobenzoate; phenyl disulphides, 2-nitrofluorene, butyloin, anisoin ethyl ether, azobisisobutyronitriles, tetramethylthiuram disulphide. Illustrative photoinitiators include 2,4,6 Trimethylbenzoyldiphenylphosphine oxide (TPO) and bis (2,6-dimethoxybenzoyl)-2,4,4 trimethylpentylphosphine oxide.

The photoinitiator may be included in the curable composition in various amounts. However, generally the photoinitiator is present at a relatively high amount in order to increase the degree of cure in the protective layer. In embodiments, the photoinitiator is present in an amount of at least 5%, at least 10%, at least 12%, or in a range of from 5% to 15%, from 10% to 15%, or from 12% to 15%. In embodiments in which more than one species of photoinitiator is present in the curable composition, these amounts refer to the total amount of photoinitiator in the curable composition. A portion of the photoinitiator may be provided as a blend with the selected polymer(s), oligomer(s), monomer(s), and clay mineral(s) and an additional amount may be added into the blend.

In embodiments, the curable composition from which the protective layer is formed consists or consists essentially of one or more types of a polymer (e.g., one), one or more types of an oligomer (e.g., one); one or more types of monomer (e.g., three or four); one or more types of a clay mineral (e.g., one); and one or more types of photoinitiators (e.g., one or two). In these embodiments, any of the polymers, oligomers, monomers, clay minerals, and photoinitiators described above may be used, in any of the amounts described above.

The curable compositions may be formed by combining and mixing the selected components. As further described below, to form the protective layer, the curable composition is printed and then cured to induce free radical polymerization reactions between the components of the curable composition.

In the present printed electronic devices, the protective layer covers the underlying plurality of electrode traces. From a top view of the device (e.g., see protective layer 116 in FIG. 1A), this means the lateral (i.e., in plane) dimensions of the protective layer at least match the lateral dimensions of each of the electrode traces of the plurality of electrode traces which underlie the protective layer. However, the protective layer can also cover, i.e., extend laterally over, a region beyond edges of each electrode trace of the plurality of electrode traces. The protective layer can also cover a portion of each contact pad of the plurality of contact pads. Aside from these guidelines regarding the lateral extension of the protective layer relative to the plurality of electrode traces and to the plurality of contact pads, the lateral extension of the protective layer in other regions and its overall shape may otherwise vary. Illustrative shapes and lateral dimensions include those described in U.S. Application filed Jul. 18, 2018, titled "COATED PRINTED ELECTRONIC DEVICES EXHIBITING IMPROVED YIELD," which is hereby incorporated by reference in its entirety.

The protective layers of the present printed electronic devices may be characterized by an average thickness. By "average thickness" it is meant the average value of the thickness of the protective layer measured perpendicular to the layers of the device and at a number of representative positions across the surface of the protective layer. In embodiments, the average thickness is less than 30 µm, less than 25 µm, less than 20 µm, in the range from 1 µm to 30 µm, from 1 µm to 25 µm, or from 10 µm to 20 µm.

The protective layers of the present printed electronic devices may be characterized by their degree of cure. The degree of cure may be measured using Transmission Fourier Transform Infrared (FTIR) Spectroscopy, including by monitoring spectral fingerprints of certain functional groups, e.g., acrylic double bonds and $C=CH_2$ groups. Specifically, certain functional groups are present in uncured resins and their presence is indicated by obtaining measurable absorption at specific wavelengths of light. However, absorption at these specific wavelengths of light decreases as the degree of cure increases (since the functional groups react during the polymerization process). A fully cured protective layer is indicated by obtaining no measurable absorption at these specific wavelengths. In embodiments, the protective layer is characterized as being fully cured.

The protective layers of the present printed electronic devices may be characterized by the yield exhibited by the printed electronic device coated with the protective layer. Yield refers to the number of printed electronic devices on a roll exhibiting no measurable defects divided by the total number of printed electronic devices tested on the roll. Typically, a roll has from 120,000 to 1,200,000 printed electronic devices. Yield may be reported as a percentage and is desirably as close to 100% as possible. To measure yield, the electrical response of printed electronic devices on a roll is measured to determine the presence of defects including shorts, leaks, open, and out of bounds. A variety of testers may be used for measuring the electric response of a printed electronic device and determining the presence/absence of these defects. The particular tester and criteria used to determine the presence/absence of defects is not critical provided each printed electronic device in the roll uses the same tester, testing conditions and criteria. As further described below, the protective layers of the present printed electronic devices may be characterized by a drop-in-yield. Drop-in-yield is determined by measuring yield as described above for printed electronic devices without a protective layer and measuring yield as described above for the printed electronic devices with the protective layer. Drop-in-yield is the difference between the two yield values. Desirably the drop-in-yield is as close to zero as possible, i.e., the protective layer does not affect the yield at all.

A top view of an illustrative printed electronic device 100 is shown in FIG. 1A. The process and cross-process directions which define the lateral dimensions of each of the layers of the device 100 are labeled in FIG. 1A. An outline illustrating the edge of a substrate 102 upon which the layers of the device 100 is shown. However, the substrate 102 may be much larger such that many printed electronic devices may be printed thereon. The device 100 comprises a plurality of contact pads 104a-j arranged in a pattern and a plurality of electrode traces 106a-j arranged in another pattern. The pattern of the plurality of contact pads 104a-j is that of two, linear arrays 105a, b, extending parallel to one another and parallel to the cross-process direction. The linear arrays 105a, b are spaced apart in the process direction to define a space between. In this embodiment, each contact pad 104a-j has a rectangular shape. In the present disclosure, the term "rectangular" includes rectangles having sharp corners as well as rectangles having rounded corners such as those shown in FIG. 1A. However, other shapes may be used for the contact pads 104a-j. Moreover, each contact pad need not have the same shape. Other contact pads and arrangements which may be used include those described in U.S.

Application filed Jul. 18, 2018, titled "PRINTED ELECTRONIC DEVICES EXHIBITING IMPROVED YIELD," which is hereby incorporated by reference in its entirety.

The plurality of electrode traces 106a-j is positioned in the space defined by the linear arrays 105a, b. Each electrode trace of traces 106a-j is in electrical communication with an associated contact pad of pads 104a-j, e.g., electrode trace 106a and contact pad 104f are an associated pair. The plurality of electrode traces 106a-j includes both top electrode traces 106a-e and bottom electrode traces 106f-j. (Both are visible because a ferroelectric layer formed between top and bottom electrode traces 106a-e, 106f-j is not shown.) Portions of both top and bottom electrode traces 106a-e, 106f-j are configured as stripes wherein the stripe portions of top electrode traces 106a-e are oriented parallel to each other and the stripe portions of the bottom electrode traces 106f-j are oriented parallel to each other and orthogonal to the top electrode traces 106a-e, thereby forming a grid pattern. The remaining portions of the top and bottom electrode traces 106a-e, 106f-j extend linearly to their associated contact pads. In this embodiment, the grid pattern is oriented 45° with respect to the process and cross-process directions, although other orientations may be used.

Figure 1B:
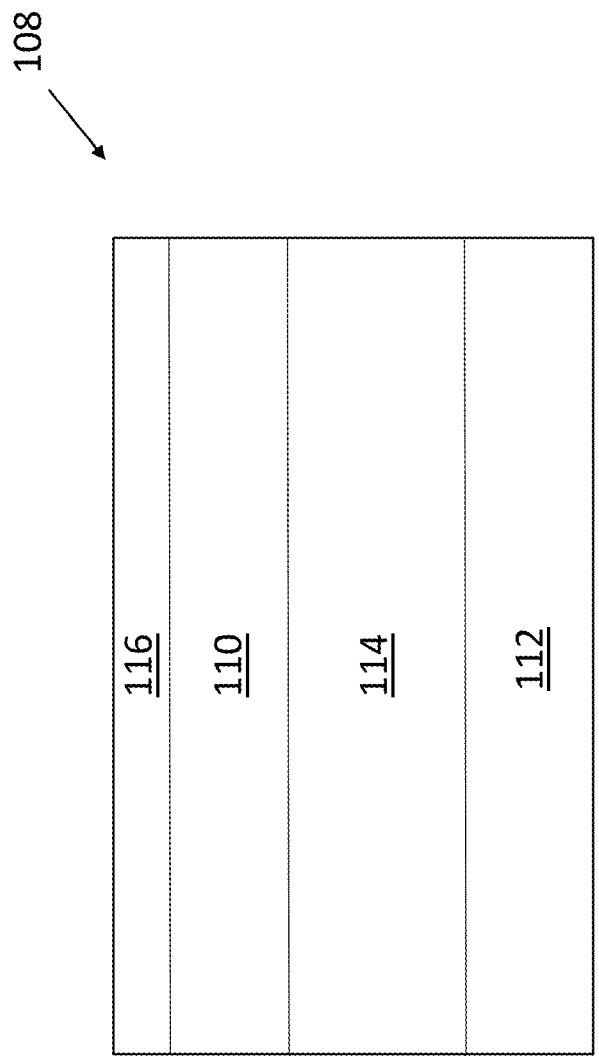
FIG. 1B depicts a cross-sectional view of a memory cell of the printed electronic device of FIG. 1A.

As noted above, each memory cell of the plurality of memory cells is formed at an intersection of a pair of electrode traces of the plurality of electrode traces 106a-j. One such intersection and memory cell is labeled 108. Although not shown in FIG. 1A, the printed electronic device 100 comprises the ferroelectric layer between the top and bottom electrode traces 106a-e, 106f-j. A cross-sectional view of the memory cell 108 is illustrated in FIG. 1B, showing a top electrode layer 110, a bottom electrode layer 112, and a ferroelectric layer 114 between the top and bottom electrode layers 110, 112. The top electrode layer 110 corresponds to a region of the top electrode trace 106c. The bottom electrode layer 112 corresponds to a region of the bottom electrode trace 106h at the intersection. A portion of a protective layer 116 covers the top electrode layer 110. Turning back to FIG. 1A, the device 100 includes 25 memory cells. Due to the configuration of the plurality of electrode traces 106a-j (i.e., grid pattern), the plurality of memory cells is arranged as a 5×5 matrix of memory cells.

As shown in FIG. 1A, the printed electronic device 100 further comprises the protective layer 116. In this embodiment, the protective layer 116 is the topmost material layer of the device 100. The protective layer 116 extends over each electrode trace of the plurality of electrode traces 106a-j to a region beyond each edge of each electrode trace, thereby providing a buffer zone surrounding each electrode trace. As a result, a portion of each contact pad of the plurality of contact pads 104a-j is also covered by the protective layer 116 in an overlapping region. For clarity, the outer perimeter of the contact pad 104a is marked by a black dashed box and an inner white dashed box marks an inner perimeter of the protective layer 116. Each contact pad of contact pads 104b-j may be similarly overlapped by the protective layer 116.

Rolls of printed electronic devices according to the embodiment of device 100 were fabricated according to the method described below. Specifically, a printing system comprising a printing apparatus configured to gravure print silver (for the plurality of electrode traces), a printing apparatus configured to extrusion coat a ferroelectric material (for the ferroelectric layer), a printing apparatus configured to rotary screen print carbon (for the plurality of contact pads), and a printing apparatus configured to rotary screen print a curable composition (for the protective layer) was used. Curable compositions composed of 30-40% amine modified polyester acrylate, 1-5% acrylated amine oligomer, 25-35% dicyclopentenyloxyethyl acrylate, 1-5% isobornyl acrylate, 1-5% hexanediol diacrylate, 0-1% trimethylolpropane tri(meth)acrylate, 1-5% benzophenone, and 4% Bis(2,4,6-Trimethylbenzoyl)phenylphosphine oxide were used. The curable compositions were cured using radiation having a wavelength in the range of from 250 to 750 nm, for a period of time of approximately 1 second, at room temperature and ambient atmosphere. The protective layers were fully cured as measured using a Nicolet 6700 FTIR bench equipped with a Nicolet Continuum microscope accessory as indicated by obtaining no measurable absorbance at 1635 cm$^{-1}$ and 1618 cm$^{-1}$ (spectral fingerprints for acrylic double bonds) and no measurable absorbance at 812 cm$^{-1}$ (spectral fingerprint for C=CH$_2$ monomer groups). Yield was measured/calculated as described above and was found to be approximately 100%; i.e., 100% of the devices exhibited no measurable defects. The drop-in-yield was also measured/calculated as described above as was found to be approximately 0%, i.e., the protective layer configured as the protective layer 116 had no measurable effect on yield.

A roll of comparative printed electronic devices was fabricated using the same printing system and the same method, but a different protective layer was used (i.e., a different curable composition was used). Specifically, the protective layer was formed from a curable composition known as Gloss Varnish 5 KG UVLG 6 available from Marabu Company. Otherwise, the configuration of the protective layer was the same as the protective layer 116. The curing conditions were identical to those for the devices according to the embodiment of the device 100 described above. Yield was measured/calculated and was found to be approximately 80%, i.e., only 80% of the devices exhibited no measurable defects. The drop-in-yield of devices was also measured/calculated as described above as was found to be approximately 20%. Thus, the results showed that the yield (drop-in-yield) for devices according to the embodiment of device 100 was significantly greater (smaller) than that of the comparative printed electronic device.

As described above, contact pads arranged in linear arrays and electrode traces arranged in a grid pattern to form a matrix of memory cells may be used. However, other arrangements and patterns may be used. For example, contact pads may be arranged in circular or matrix patterns and may assume a variety of lateral positions over an underlying substrate with respect to the electrode traces and memory cells. In addition, by an appropriate configuration of electrode traces, memory cells can be arranged to form linear arrays, e.g., using a single (1) common bottom electrode and N parallel top electrodes oriented orthogonal to the bottom electrode (i.e., a 1×N linear array). The matrix array shown in FIG. 1A is an illustrative N×N matrix array, having N top electrode traces and N bottom electrode traces. However, nonequal numbers of top and bottom electrode traces may be used, e.g., M bottom electrode traces and N top electrode traces to form an M×N matrix array. In addition, as noted above, the orientation of the pattern of the plurality of electrode traces relative to the plurality of contact pads may vary. In addition, the portions of the electrode traces extending from the memory cells to their associated contact pads can assume a variety of paths.

The materials used for the various other layers of the printed electronic device depend upon the application for the device and the particular function of each layer. Illustrative materials for the substrate include silicon, glass, polymer, paper, etc. Illustrative materials for the electrode traces/ electrode layers include metals, e.g., silver, or conductive polymers, e.g., polyethylenedioxythiophene. Illustrative materials for the ferroelectric layer include ferroelectric polymers, e.g., copolymer of polyvinylidene fluoride and trifluoroethylene. Other layers may be included in the printed electronic devices, e.g., insulating layers composed of insulating polymers, e.g., acrylic-based polymers, between a substrate and bottom electrode traces, which improve planarization and promote adhesion. Another layer which may be included is a second protective layer immediately underlying the protective layer described above. This second protective layer may be composed of an elastic material such as polypropylene glycol (PPG), silicon rubber, natural rubber, polyvinyl acetate or another acrylate-based resin. Its lateral dimensions and overall shape may be the same as the protective layer described above. Other illustrative materials for the various other layers (i.e., besides the protective layer) of the printed electronic devices include those described in U.S. Pat. No. 9,412,705 and International Pat. Pub. Nos. WO 2006/135246 and WO 2006/135247, each of which is hereby incorporated by reference in its entirety.

In embodiments, the printed electronic device does not comprise a layer formed of a metal, a metal oxide, a metal nitride, a metal carbide, a metal oxynitride, a metal oxyboride, or a combination thereof, which is in contact with the protective layer, other than the layers associated with the contact pads (e.g., carbon), the layers associated with the electrode traces (e.g., silver), or the ferroelectric layer. In such embodiments, the printed electronic device does not comprise the sort of barrier layers typically used with display devices, e.g., organic light emitting devices. In such embodiments, the protective layer is only in contact with an underlying second protective layer composed of an organic material (as described above), an underlying layer associated with the contact pads, one or more underlying layers associated with the electrode traces, and/or an underlying ferroelectric layer. In such embodiments, the printed electronic device may consist of or consists essentially of the plurality of contact pads, the plurality of electrode traces, the plurality of memory cells, the protective layer, optionally, a second protective layer underlying the protective layer and composed of an organic material, and optionally, an insulating layer between a substrate and the set of bottom electrode traces of the plurality of electrode traces.

Aside from the guidance provided above, other dimensions of the features of the printed electronic devices, the thicknesses of the material layers, as well as the overall dimensions of the devices may be selected depending upon the function of the material layers, the application for the devices and number of memory cells.

The printed electronic devices may be used in a variety of applications, including product authentication applications for print cartridges, event tickets, credit cards, etc.

Methods of fabricating the printed electronic devices are also provided. The methods are carried out on printing systems comprising one or more printing apparatuses configured to print material layers using a thin-film printing technique, e.g., ink-jet printing, screen printing, flexographic printing, offset printing, electrographic printing, laser printing, gravure printing, extrusion coating, etc. However, generally, processes such as sputtering, chemical vapor deposition, plasma enhanced chemical vapor deposition, evaporation, sublimation, electron cyclotron resonance-plasma enhance vapor deposition are not used. Since different material layers may be printed using different techniques, the printing system can include multiple, different types of printing apparatuses. The methods involve the sequential printing of the material layers of the desired printed electronic device, in a bottom-up, layer-by-layer fashion. The printing system may further comprise an apparatus for curing a printed curable composition to provide a protective layer. Alternatively, the curing apparatus can be a separate, stand-alone unit apart from the printing system.

In embodiments, a method of fabricating a printed electronic device comprises printing a plurality of bottom electrode traces on a substrate; printing a layer of a ferroelectric material on the plurality of bottom electrode traces; printing a plurality of top electrode traces on the layer of the ferroelectric material, wherein the plurality of bottom and top electrode traces forms a plurality of electrode traces arranged in a pattern and defines a plurality of memory cells, each memory cell located at an intersection of a pair of electrode traces of the plurality of electrode traces; printing a plurality of contact pads on the plurality of electrode traces, wherein the plurality of contact pads are arranged in a another pattern and each electrode trace of the plurality of electrode traces is in electrical communication with an associated contact pad of the plurality of contact pads; printing a curable composition on the plurality of electrode traces and the plurality of contact pads; and curing the curable composition to provide the protective layer.

Curing may be carried out by exposing the curable composition to radiation under conditions to induce the free radical polymerization reactions between components of the curable composition as described above. The curing conditions include, for example, the wavelength of the radiation, the curing temperature, the curing time (which may be adjusted by the curing speed, e.g., when the source of the radiation is scanned over the printed curable composition), and the curing atmosphere. Various wavelengths may be used. In embodiments, the wavelength is in the range of from 200 nm to 800 nm, from 250 nm to about 750 nm, or from 300 nm to 700 nm. Any light source providing wavelengths within these ranges may be used, e.g., mercury arc lamps. In embodiments, the curing temperature is room temperature, i.e., from about 20° C. to about 25° C. In embodiments, the curing time is in the range of from 1 second to 10 minutes, 1 second to 1 minute, or about 1 second. The curing may be performed in an ambient atmosphere (i.e., air at atmospheric pressure).

In the method of fabricating the printed electronic device, the plurality of electrode traces, the plurality of contact pads, and the plurality of memory cells which are printed may be arranged in any of the corresponding patterns described above. In the method, any of the curable compositions described above may be used and the resulting protective layer may be configured as described above.

Methods of using a printed electronic device are also provided. In embodiments, such a method comprises contacting a plurality of contact pads of a printed electronic device with a plurality of pins of a read/write unit. This contact enables application of voltage waveforms to control the reading/writing of the plurality of memory cells and to sense the state of the memory cells during reading. Any of the printed electronic devices disclosed herein may be used. The configuration of the read/write unit is not particularly limited, provided the plurality of pins is arranged in a pattern corresponding to the pattern of the plurality of contact pads of the printed electronic device. Commercially available read/write units may be used.

Use of directional terms, such as top, bottom, right, left, front, back, upper, lower, etc. are merely intended to facilitate reference to various surfaces that form components of the devices referenced herein and are not intended to be limiting in any manner.

It will be appreciated that variants of the above-disclosed and other features and functions or alternatives thereof, may be combined into many other different systems or applications. Various presently unforeseen or unanticipated alternatives, modifications, variations or improvements therein may be subsequently made by those skilled in the art, which are also intended to be encompassed by the following claims.

What is claimed is:

1. A printed electronic device comprising:
a plurality of contact pads arranged in a pattern,
a plurality of electrode traces arranged in another pattern, the plurality of electrode traces comprising a set of bottom electrode traces and a set of top electrode traces, each electrode trace in electrical communication with an associated contact pad of the plurality of contact pads,
a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers, and
a protective layer covering the plurality of electrode traces, the protective layer formed from a curable composition comprising an amine modified polyester (meth)acrylate, a (meth)acrylated amine oligomer, a (meth)acrylate monomer, a clay mineral, and a photoinitiator,
wherein the device exhibits a drop-in-yield of zero.

2. The device of claim 1, wherein the (meth)acrylate monomer comprises one or more cyclic groups.

3. The device of claim 1, wherein the curable composition comprises a monofunctional (meth)acrylate monomer, a difunctional (meth)acrylate monomer, and a trifunctional (meth)acrylate monomer.

4. The device of claim 3, wherein the monofunctional (meth)acrylate monomer comprises one or more cyclic groups.

5. The device of claim 1, wherein the curable composition comprises from 25% to 45% of the amine modified polyester (meth)acrylate, from 0.5% to 7% of the (meth)acrylated amine oligomer, from 20% to 50% of the (meth)acrylate monomer, from 15% to 35% of the clay mineral, and from 5% to 15% of the photoinitiator.

6. The device of claim 5, wherein the (meth)acrylate monomer is a combination of a monofunctional (meth)acrylate monomer, a difunctional (meth)acrylate) monomer, and a trifunctional (meth)acrylate monomer.

7. The device of claim 6, wherein the monofunctional (meth)acrylate monomer comprises one or more cyclic groups.

8. The device of claim 6, wherein the monofunctional (meth)acrylate monomer is present at an amount of from 18% to 40%, the difunctional (meth)acrylate monomer is present at an amount of from 0.5% to 7%, and the trifunctional (meth)acrylate monomer is present at an amount of from 0.1 to 2%.

9. The device of claim 1, wherein the curable composition consists essentially of one or more types of the amine modified polyester (meth)acrylate, one or more types of the (meth)acrylated amine oligomer, one or more types of the (meth)acrylate monomer, one or more types of the clay mineral, and one or more types of the photoinitiator.

10. The device of claim 9, wherein the curable composition has from 25% to 45% of the amine modified polyester (meth)acrylate, from 0.5% to 7% of the (meth)acrylated amine oligomer, from 20% to 50% of the (meth)acrylate monomer, from 15% to 35% of the clay mineral, and from 5% to 15% of the photoinitiator.

11. The device of claim 10, wherein the (meth)acrylate monomer is a combination of a monofunctional (meth)acrylate monomer, a difunctional (meth)acrylate) monomer, and a trifunctional (meth)acrylate monomer.

12. The device of claim 11, wherein the monofunctional (meth)acrylate monomer comprises one or more cyclic groups.

13. The device of claim 12, wherein the monofunctional (meth)acrylate monomer is present at an amount of from 18% to 40%, the difunctional (meth)acrylate monomer is present at an amount of from 0.5% to 7%, and the trifunctional (meth)acrylate monomer is present at an amount of from 0.1 to 2%.

14. The device of claim 1, wherein the device consists essentially of the plurality of contact pads, the plurality of electrode traces, the plurality of memory cells, the protective layer, a second protective layer underlying the protective layer and composed of an organic material, and an insulating layer between a substrate and the set of bottom electrode traces of the plurality of electrode traces.

15. The device of claim 1, wherein the protective layer is fully cured.

16. A plurality of printed electronic devices comprising a substrate and a plurality of printed electronic devices on the substrate, each device configured according to the device of claim 1.

17. A printed electronic device comprising:
a plurality of contact pads arranged in a pattern,
a plurality of electrode traces arranged in another pattern, the plurality of electrode traces comprising a set of bottom electrode traces and a set of top electrode traces, each electrode trace in electrical communication with an associated contact pad of the plurality of contact pads,
a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers, and
a protective layer covering the plurality of electrode traces, the protective layer formed from a curable composition comprising an amine modified polyester (meth)acrylate, a (meth)acrylated amine oligomer, a (meth)acrylate monomer, a clay mineral, and a photoinitiator, wherein the plurality of contact pads is arranged in two arrays extending parallel to one another and defining a space therebetween, and further wherein the plurality of electrode traces is arranged in a grid pattern positioned in the space.

18. A method of fabricating a printed electronic device, the method comprising:
printing a plurality of bottom electrode traces on a substrate;
printing a layer of a ferroelectric material on the plurality of bottom electrode traces;

printing a plurality of top electrode traces on the layer of the ferroelectric material, wherein the plurality of bottom and top electrode traces forms a plurality of electrode traces arranged in a pattern and defines a plurality of memory cells, each memory cell located at an intersection of a pair of electrode traces of the plurality of electrode traces;

printing a plurality of contact pads on the plurality of electrode traces, wherein the plurality of contact pads is arranged in another pattern and each electrode trace of the plurality of electrode traces is in electrical communication with an associated contact pad of the plurality of contact pads;

printing a curable composition to cover the plurality of electrode traces, the curable composition comprising an amine modified polyester (meth)acrylate, a (meth)acrylated amine oligomer, a (meth)acrylate monomer, a clay mineral, and a photoinitiator; and curing the curable composition to provide a protective layer, wherein the fabricated device exhibits a drop-in-yield of zero.

19. A method of using a printed electronic device, the method comprising contacting a plurality of contact pads of a coated, printed electronic device with a plurality of pins of a read/write unit, the device comprising the plurality of contact pads arranged in a pattern, a plurality of electrode traces arranged in another pattern, the plurality of electrode traces comprising a set of bottom electrode traces and a set of top electrode traces, each electrode trace in electrical communication with an associated contact pad of the plurality of contact pads, a plurality of memory cells, each memory cell located at an intersection of a pair of electrode traces of the plurality of electrode traces and comprising a bottom electrode layer formed from a region of one of the bottom electrode traces, a top electrode layer formed from a region of one of the top electrode traces, and a ferroelectric layer between the bottom and top electrode layers, and a protective layer covering the plurality of electrode traces, the protective layer formed from a curable composition comprising an amine modified polyester (meth)acrylate, a (meth)acrylated amine oligomer, a (meth)acrylate monomer, a clay mineral, and a photoinitiator, wherein the device exhibits a drop-in-yield of zero.

* * * * *